US012363914B2

(12) United States Patent
Banerjee et al.

(10) Patent No.: US 12,363,914 B2
(45) Date of Patent: Jul. 15, 2025

(54) HYBRID TRANSISTOR AND MEMORY CELL (71) Applicant: The Regents of the University of California, Oakland, CA (US)

(72) Inventors: Kaustav Banerjee, Goleta, CA (US); Chao-Hui Yeh, Goleta, CA (US); Wei Cao, Goleta, CA (US); Arnab Pal, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 488 days.

(21) Appl. No.: 17/965,099

(22) Filed: Oct. 13, 2022

(65) Prior Publication Data
US 2023/0124085 A1 Apr. 20, 2023

Related U.S. Application Data

(60) Provisional application No. 63/255,526, filed on Oct. 14, 2021.

(51) Int. Cl.
*H10B 63/00* (2023.01)
*H10N 70/00* (2023.01)

(52) U.S. Cl.
CPC ............. *H10B 63/30* (2023.02); *H10B 63/84* (2023.02); *H10N 70/883* (2023.02)

(58) Field of Classification Search
CPC ........ H10B 63/30; H10B 63/84; H10B 63/80; H10N 70/883; H10N 70/823; H10D 30/47; H10D 99/00; H10D 62/80; H10D 62/82; H10D 64/685; G11C 2213/50; G11C 13/0002
See application file for complete search history.

(56) References Cited

U.S. PATENT DOCUMENTS 11,444,124 B2 * 9/2022 Cheng ................ G11C 13/0028

OTHER PUBLICATIONS

Chen, et al., "Wafer-scale integration of two-dimensionalmaterials in high-density memristive crossbar arrays for artificial neural networks", Nature Electronics, 2020, vol. 3, pp. 638-645.
Gao, et al., "Memristor-based analogue computing for braininspired sound localization with in situ training", Nature Communications, 2022, vol. 13:2026, pp. 1-8.
Lin, et al., "Oxygen-assisted synthesis of hBN films for resistive random access memories", Applied Physics Letters, 2019, 115, pp. 073101-073101-3.
Sivan, et al., "All WSe2 1T1R resistive RAM cell for future monolithic 3D embedded memory integration", Nature Communications, 2019, 10:5201, pp. 1-12.

(Continued)

*Primary Examiner* — David Vu
(74) *Attorney, Agent, or Firm* — Greer, Burns & Crain, Ltd.; Steven P. Fallon (57) ABSTRACT

A hybrid switch and memory cell includes a transistor device that has an atomically-thin semiconductor material channel, source/drain electrodes, and gate dielectric. The cell includes a resistive-random-access-memory having a thin conductive edge and a 2D insulator layer over the thin conductive edge, wherein the 2D insulator layer extends over the semiconductor channel and serves as the gate dielectric in the transistor device.

15 Claims, 6 Drawing Sheets

(56) References Cited

OTHER PUBLICATIONS

Tang, et al., "Wafer-scale solution-processed 2D material analog resistive memory array for memory-based computing", Nature Communications, 2022, 13:3037, pp. 1-9.

Wang, et al., 3D Monolithic Stacked 1T1R cells using Monolayer MoS2 FET and hBN RRAM Fabricated at Low (150?? C) Temperature, IEEE, 2018, pp. IEDM18-528-IEDM18-531.

Wu, et al., "Thinnest Nonvolatile Memory Based on Monolayer h-BN", Advanced Materials, 2019, vol. 31, pp. 1-7.

Xie, et al., "Hexagonal boron nitride (h-BN) memristor arrays for analog-based machine learning hardware", npj 2D Materials and Applications, 2022, vol. 50, pp. 1-7.

Yang, et al., "A 28nm 1.5Mb Embedded 1T2R RRAM with 14.8 Mb/mm2 Using Sneaking Current Suppression and Compensation Techniques", IEEE, 2020.

Yen, et al., "High Performance All Nonmetal SiNx Resistive Random Access Memory with Strong Process Dependence", Scientific Reports, 2020, vol. 10:2807, pp. 1-9.

Zhuang, et al., "Nonpolar Resistive Switching of Multilayer-hBN-Based Memories", Advanced Electronic Materials, 2020, vol. 6, pp. 1-5.

* cited by examiner

- CVD graphene on sapphire
- Gap formation with ICP
- Grow $WS_2$ in the gap
- Recessed edge formation
- 1st metallization
- h-BN transfer
- $Al_2O_3$ deposition
- Top gate/self-alignment metallization

| Metrics \ Reference | [1] | [2] | [3] | [4] | This work (0.5T0.5R) |
|---|---|---|---|---|---|
| Active switching Layer | CVD h-BN | Liquid exfoliation $MoS_2$ | CVD h-BN | $WO_3$/ $WSe_2$ | CVD h-BN |
| Layer Thickness | 8-10 nm | 10.5-11.4 nm | 5 nm | 6 nm | 5 nm |
| Forming Voltage | Forming-free | Forming-free | Forming-free | Forming-free | Forming-free |
| Switching Voltage | 1/-1V | 0.65/-0.9V | 0.5/ -0.8 V | 0.8/ 0.3 V (unipolar) | 0.9/ -2.0 V |
| Switching Time | NA | 40 ns | NA | 700 ns | < 10 ns |
| Retention time | $10^4$ s | $10^8$ s | > 5000 s | > $10^4$ s | > $10^6$ s (30 days) |
| Endurance | 100 cycles | $10^7$ cycles | > 50 cycles | 90 cycles | > 1000 cycles |
| On/Off Ratio | 1R: $10^2$ | 1R:10 | 1R: 5  1T1R: 4 | 1R: $10^3$  1T1R: $10^2$ | 1R: $10^4$  0.5T0.5R: $10^2$ |
| Switching Energy — Transistor part | NA | NA | 2.88 pJ/bit (local back gate) | 2.15 pJ/bit (back gate) | 0.096 pJ/bit (top gate) |
| Switching Energy — RRAM part | 125 fJ/bit | NA | NA | 2.6 pJ/bit | 0.07 pJ/bit |
| On-current (Transistor part) | NA | NA | 15 µA/µm (1L $MoS_2$) | 150 µA/µm (Multilayer $WSe_2$) | 127 µA/µm (1L $WS_2$) |
| Working Area | 9 µm² (RRAM only) | 1.25 µm² (RRAM only) | 1040 µm² (1T+1R) | 28 µm² (1T+1R) | 12 µm² (0.5T0.5R) |

FIG. 3A

| Metrics \ Reference | [5] | [6] | [7] | [8] | Invention (0.5T0.5R) |
|---|---|---|---|---|---|
| Active switching Layer | CVD h-BN | CVD h-BN | CVD h-BN | CVD h-BN | CVD h-BN |
| Layer Thickness | 0.4 nm | 8 nm | Multilayer | Multilayer | 5 nm |
| Forming Voltage | Forming-free | NA | NA | 3-8 V | Forming-free |
| Switching Voltage | 0.7/ -0.5 V | 3.0/ -2.0 V | 2.0/ -2.0 V | 2.75/ -2.5 V | 0.9/ -2.0 V |
| Switching Time | <15 ns | NA | < 5 µs | 200 ns | < 10 ns |
| Retention time | > $10^5$ s | > $10^6$ s | > $3\times10^3$ s | NA | > $10^6$ s (30 days) |
| Endurance | 50 cycles | 1500 cycles | 70 cycles | 80,000 cycles | > 1000 cycles |
| On/Off Ratio | 1R: $10^7$ | 1R: $10^4$ | 1R: $10^8$ | 1R: $10^6$ | 1R: $10^4$ 0.5T0.5R: $10^2$ |
| Switching Energy — Transistor part | NA | NA | NA | NA | 0.096 pJ/bit (top gate) |
| Switching Energy — RRAM part | NA | NA | NA | 20 fJ/bit | 0.07 pJ/bit |
| On-current (Transistor part) | NA | NA | NA | NA | 127 µA/µm (1L $WS_2$) |
| Working Area | 1 µm² (RRAM only) | 25 µm² (RRAM only) | ~ 10 µm² (RRAM only) | ~ 0.02 µm² (RRAM only) | 12 µm² (0.5T0.5R) |

FIG. 3B

| Metrics \ Reference | [9] | [10] | [11] | Invnetion (0.5T0.5R) |
|---|---|---|---|---|
| Active switching Layer | Oxide | TiN/TaOx/HfOx/TiN | $SiN_x$ | CVD h-BN |
| Layer Thickness | NA | 8nm-thick HfOx 45nm-thick TaOy | 25 nm | 5 nm |
| Forming Voltage | -0.6/1 V | NA | 7-12V | Forming-free |
| Switching Voltage | 1.5/-1.05 | 1.5/-1.4 | 3/-2 | 0.9/ -2.0 V |
| Switching Time | < 10 ns | 50 ns | 1 μs | < 10 ns |
| Retention time | > 6000 s (@ 150 °C) | 2.4 years (@ 60°C) | $10^4$ | > $10^6$ s (30 days) |
| Endurance | 100k | $10^{11}$ | $10^5$ | > 1000 cycles |
| On/Off Ratio | 1T1R: 50 | 1T1R: < $10^1$ | 1R: $10^4$ | 1R: $10^4$ 0.5T0.5R: $10^2$ |
| Switching Energy — Transistor part | NA | Total consumption ~30-60 pJ/bit | NA | 0.096 pJ/bit (top gate) |
| Switching Energy — RRAM part | NA | | 50 pJ/bit | 0.07 pJ/bit |
| On-current (Transistor part) | 28 nm FinFET | NA | NA | 127 μA/μm (1L $WS_2$) |
| Working Area | (0.27μm*0.195 μm) 0.0527 μm² (1T2R) | 0.25 μm² (1T1R) | NA | 12 μm² (0.5T0.5R) |

HYBRID TRANSISTOR AND MEMORY CELL

PRIORITY CLAIM AND REFERENCE TO RELATED APPLICATION

The application claims priority under 35 U.S.C. § 119 and all applicable statutes and treaties from prior U.S. provisional application Ser. No. 63/255,526 which was filed Oct. 14, 2021.

STATEMENT OF GOVERNMENT INTEREST

This invention was made with government support under W911NF-18-0366 awarded by the Army Research Laboratory-Army Research Office. The government has certain rights in the invention.

FIELD

The field of the invention is semiconductor devices and fabrication. The invention particularly concerns resistive-random-access-memory (RRAM) cell architectures. The invention is generally applicable to RRAM, and has specific example applications to in-memory and neuromorphic computing, which help mimic the workings of the human brain with significant gains in computational energy-efficiency.

BACKGROUND

Next-generation deep learning and neuromorphic chips will certainly require high-density integration of embedded memory. Although mature silicon-based memory technologies can be used for current data storage applications, such technology is insufficient to meet all demands of emerging computation-in-memory architectures. RRAM is considered as one of the most promising next-generation memory devices due to its non-volatility, high switching-speed, low switching-energy, and small footprint. These characteristics make RRAM an attractive candidate for implementing conventional digital memory such as cache memory (SRAM—static random access memory) and dynamic RAM (DRAM) etc., and also for analog memristors in the emerging neuromorphic computing domain.

One problem with RRAM concerns the formation of unstable oxygen-ion in the metal oxide switching materials during long-term SET/RESET cycling operation, in the form of undesired redox reactions with electrodes, overgrowth of filaments, or unwanted diffusion (or loss) of filament atoms, which can lead to severe endurance failure. See, B. Chen et al., "Physical mechanisms of endurance degradation in TMO-RRAM," in *IEDM Tech. Dig.*, December 2011, pp. 12.3.1-12.3.4.

Some of the present inventors evaluated and described the prospect of monolithic 3D integration with 2D materials. See, Jiang et al., "Ultimate monolithic-3D integration with 2D materials: Rationale, prospects, and challenges," Journal of the Electron Devices Society, Volume 7, pp 878-887 (2019). The paper described vertically stacked atomically-thin $MoS_2$ channel FETs in M3D with h-BN dielectric. Another publication describes general scalability advantages of 2D semiconductor materials. W. Cao, J. Kang, D. Sarkar, W. Liu and K. Banerjee, "2D semiconductor FETs-Projections and design for sub-10 nm VLSI," IEEE Transactions on Electron Devices, Vol. 62, No. 11, pp. 3459-3469, 2015. Prior Publications Related to Rram Compared in FIGS. 3A-3C The following publications describe devices and memory arrays based upon memory cells that each include one transistor and one resistive-random access device, and can be referred to as a "1T1R" device. This places a constraint on integration density. As described in the detailed description below, preferred embodiments of the invention provide performance and/or scale advantages over devices described in the publications, whose performance comparison data are included in FIGS. 3A-3C.

Pub [1]— Xie, et al, "Hexagonal boron nitride (h-BN) memristor arrays for analog-based machine learning hardware," 2D Mater. Appl., vol. 6, no. 1, pp. 50, July 2022.

Pub [2]— Tang et al., "Wafer-scale solution-processed 2D material analog resistive memory array for memory-based Computing," Nat. Commun., vol. 13, no. 1, pp. 3037, June 2022.

Pub [3]— Wang et al, "3D monolithic stacked 1T1R cells using monolayer $MoS_2$ FET and hBN RRAM fabricated at low (150° C.) temperature," in IEDM Tech. Dig., December 2018, pp. 22.5.1-22.5.4.

Pub [4]—M. Sivan et al., "All $WSe_2$ 1T1R resistive RAM cell for future monolithic 3D embedded memory integration, Nat. Commun., vol. 10, no. 1, pp. 5201, November 2019.

Pub [5]— Wu et al., "Thinnest nonvolatile memory based on monolayer h-BN," Adv. Mater., vol. 31, no. 15, pp. e1806790, April 2019.

Pub [6]— Zuang et al., "Nonpolar resistive switching of multilayer-hBN-based memories, Adv. Electron. Mater., vol. 6, no. 1, November 2019.

Pub [7]— Lin et al., "Oxygen-assisted synthesis of hBN films for resistive random access memories," Appl. Phys. Lett., vol. 115, pp. 073101, August 2019.

Pub [8]— Chen et al., "Wafer-scale integration of two-dimensional materials in high-density memristive crossbar arrays for artificial neural networks," Nature Electron., vol. 3, no. 10, pp. 638-645, October 2020.

Pub [9]— Yang et al., "A 28 nm 1.5 Mb Embedded 1T2R RRAM with 14.8 $Mb/mm^2$ Using Sneaking Current Suppression and Compensation Techniques," 2020 IEEE Symposium on VLSI Circuits, pp. 1-2, 2020.

Pub [10]— Gao, et al., "Memristor-based analogue computing for brain-inspired sound localization with in-situ training, Nat. Commun., vol. 13, no. 1, pp. 2026, April 2022.

Pub [11]— Yen et al., "High Performance All Nonmetal SiNx Resistive Random Access Memory with Strong Process Dependence," Sci Rep., vol. 10, no. 1, pp. 2807, February 2020.

SUMMARY OF THE INVENTION

A preferred embodiment provides a hybrid electronic switch (specifically a transistor) and memory cell that includes a field-effect transistor device with a 2D semiconductor channel material. The cell also includes a resistive-random-access-memory having a thin conductive material edge electrode and a 2D insulator (switching) layer over the conductive edge electrode, wherein the 2D insulator layer extends over the semiconductor channel of the transistor and also serves as the gate-dielectric of the field-effect transistor device.

DETAILED DESCRIPTION OF THE PREFERRED EMBODIMENTS

The invention provides an ultra-compact resistive-random-access-memory (RRAM) cell architecture, where one transistor and one RRAM can be intimately co-located in a hybrid structure. A preferred ultra-compact device merges a transition-metal-dichalcogenide (TMDC)- and graphene-based heterojunction field-effect-transistor, as well as hexagonal boron nitride (h-BN) based RRAM into a single device.

The preferred hybrid structure, which can be considered as a "0.5T0.5R" memory cell, reduces the device count by half—the first of its kind in RRAM technology history. A "recessed edge" is purposely designed with an atomically-thin conductive material (graphene) for strengthening the electric field at one of the electrode ends of the h-BN RRAM to lower operation voltage and thereby achieve reduction in power consumption. This non-volatile h-BN RRAM exhibits extraordinary performance in terms of fast switching speed, long retention time, high ON/OFF ratio, high endurance, and low switching energy, in contrast to the ubiquitous charge-based (silicon-based) memory, e.g., dynamic RAM (DRAM), static RAM (SRAM), and flash memory.

The 0.5T0.5R memory cell enabled by shared graphene edge-contact and h-BN insulator not only exhibits outstanding performance (<10 ns switching-speed), energy (~0.07 pJ/bit)- and area-efficiency, but also provides the multi-resistance-states modulated by gate voltage suggesting multibit operation, functional for future digital memory and neuromorphic experimentation platforms. The hybrid transistor can retain all the information after each SET/RESET, even after the power is turned off. This ability provides additional degree of freedom for long-term data storage compared to a conventional transistor, and can serve as the foundation for a new-generation of "intelligent chips".

In a preferred fabrication method, due to the absence of carbon diffusion through any metals or dielectrics, neither the preferred wire (MLG or doped-MLG) nor the preferred metal via require any diffusion-barrier layer, unlike Cu damascene wires that must be completely encapsulated by highly-resistive refractory metals that increase process complexity, cost, and the effective resistivity of Cu wires.

Preferred prototypes have demonstrated an ultra-compact memory cell, where one transistor and one memory can be intimately co-located. The architecture is ideal for high scalability since device count is reduced by half Given that the necessity of data-centric applications is exponentially growing in this 21st century, the present 0.5T0.5R cell can meet the demand for high-density integration of embedded memory architecture.

In terms of endurance and retention cycling of conventional oxide-based RRAM, there is a critical issue of unstable oxygen vacancy, which deteriorates performance and causes RRAM failures. Since the chemical stability of h-BN layer could prevent the chemisorption of oxygen, the present embedded h-BN RRAM can further avoid non-controllable diffusion/drift of oxygen ions in the switching layer, which can significantly increase device lifetimes. Moreover, the high thermal conductivity of h-BN switching layer could help with the heat dissipation, and thus it can avoid local overheating and hot-spots.

The present 0.5T0.5R cell can be fabricated via a manufacture-friendly process and exhibits unprecedented performance (<10 ns switching-speed), energy (~0.07 pJ/bit)-, area-efficiency, and multibit operation can be viable for all storage levels in computer memory hierarchy. Experiments demonstrated large-area 0.5T0.5R cell arrays up to ~100 $mm^2$, which can be easily scaled up to larger wafers/substrates.

The present hybrid device also provides a smart transistor due to the non-volatile nature of the embedded h-BN RRAM layer after each SET or RESET operation. Unlike conventional transistors, the present hybrid transistor can retain all the information after each SET/RESET even after the power is turned off Thus, a smart transistor is provided that can pack in much more information than a conventional transistor and can serve as the foundation for a new generation of intelligent chips that could change fundamental techniques for processing and for storing information.

A smart transistor of the invention provides a platform for neuromorphic and in-memory computing, which can provide unprecedented energy-efficiency and extend the lifetimes of batteries in electronic devices, such as laptops and cell phones.

Preferred architectures provide monolithic-3D integration via low thermal budget transistor, memory, and interconnect material and process integration breakthroughs. In our demonstrated memory scheme, all materials synthesis can be achieved using low-temperature deposition technology below 500° C. to meet the demands for realizing ultra-high density (both lateral and vertical) stacked 3D integrated circuits, in comparison with the current Si based devices that typically use fabrication temperatures between 600 and 1000° C.

Some advances and advantages provided by the invention include the following. We provide what is believed to be the first demonstration of a single 3-terminal device with electronic switch and memory functionalities co-integrated, which significantly reduces the area (and volume) overhead thereby resulting in increased lateral and vertical integration density. A preferred embodiment provides co-integration of a transistor (as the electronic switch) with a resistive-RAM (memory unit). A preferred embodiment provides a transistor and the RRAM implemented with atomically thin two-dimensional (2D) materials as the transistor-channel and RRAM active-switching materials.

Another preferred embodiment provides 2D-semiconducting transition metal dichalcogenides (TMD) for implementing the transistor channel material while a 2D-conductive-layer edge with a 2D-insulator material is used for the RRAM. The 2D-conductive layer can be realized with 2D-metallic graphene and the 2D-insulator can be realized with hexagonal boron nitride (h-BN). The thickness (or the number of layers) of all these materials can be varied to optimize any given design.

A preferred integrated transistor-memory unit is believed to achieve the least lateral and vertical footprint among other contemporary transistor-memory (typically '1T1R'— separate 1 transistor and 1 RRAM) units.

A preferred integrated transistor-memory unit enables a more compact and thinner 3D-integration and is the basis for ultra-thin monolithically integrated (M3D) large-scale memory arrays. Reduced thickness of the hybrid 3-terminal device provides better heat dissipation (due to reduced thermal resistances) as well reduced cost and energy involved in the fabrication (including etching, deposition, etc.) due to the significantly reduced vertical dimensions.

A preferred experimental 0.5T0.5R-RRAM exhibits the highest integration density and performance metrics in terms of switching speed, energy- and area-efficiency, along with great retention and endurance. However, it requires three signal lines—the word, bit and select lines for ensuring correct operation. The need for bidirectional programming input pulses complicates the overall array design and operation. A preferred embodiment provides an integrated transistor-memory unit that can be reconfigured to implement device switching with unidirectional current pulses, i.e., unipolar operation. This operation further improves energy-efficiency and integration density, and only requires two signal lines.

Preferred embodiments of the invention will now be discussed with respect to experiments and drawings. Broader aspects of the invention will be understood by artisans in view of the general knowledge in the art and the description of the experiments that follows.

Figure 1A:
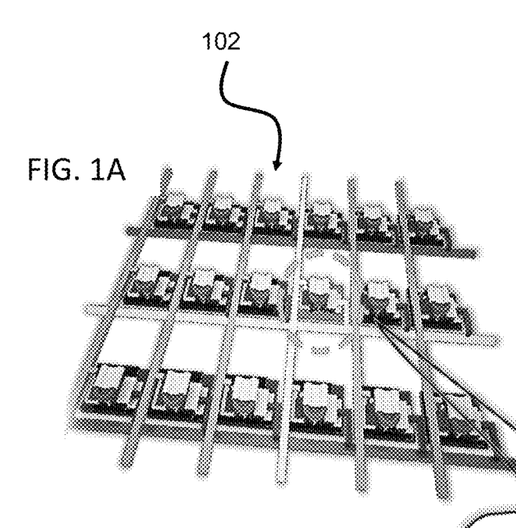
FIGS. 1A-1D respectively show a schematic diagram of a preferred 0.5T0.5R hybrid memory array, an image of a fabricated prototype of the 0.5T0.5R memory array, a current leakage potential path, and a schematic of a preferred 0.5T0.5R memory cell.
Figure 1B:
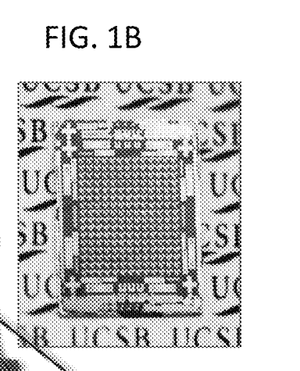
Figure 1C:
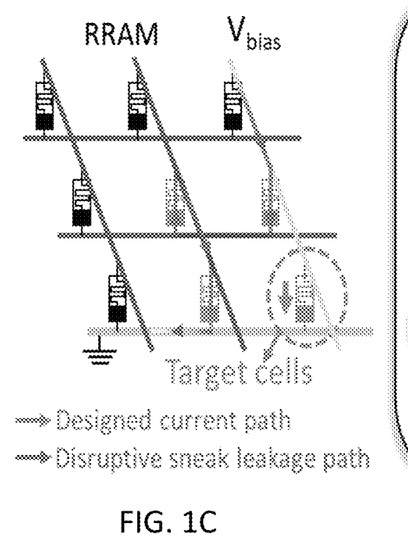
Figure 1D:
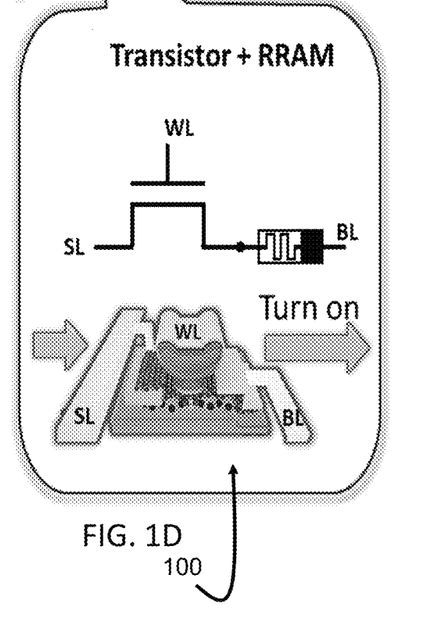

A 0.5T0.5R memory cell 100 of FIG. 1D, is the basis for a preferred memory array 102 in FIG. 1A, with a prototype shown in FIG. 1B. Construction the array 102 with the 0.5T0.5R memory cell 100 can prevent the FIG. 1C problem of leakage current of each memory cell (e.g., RRAM) in inactive memory units creating a large sneak current that may disturb the normal operation of an active cell. The individual connections to the cells in FIG. 1A are source-lines (SL) and bit-lines (BL). The wire connections along the vertical direction are SL, while the lateral connections are the BL. The source and bit lines can be implemented using any conventional metals (such as copper, cobalt, ruthenium, or tungsten or bilayers thereof), as well as engineered/doped multi-layer graphene interconnects that allow smaller aspect ratios due to their significantly higher current-carrying capacity, and therefore smaller bit-line/source-line capacitance and switching energy.

Figure 2A:
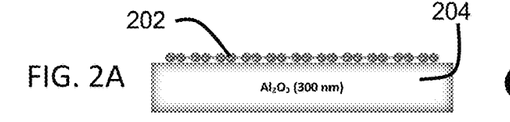
FIGS. 2A-2I illustrate fabrication and structural details of the preferred 0.5T0.5R memory cell of FIG. 1D.
Figure 2B:
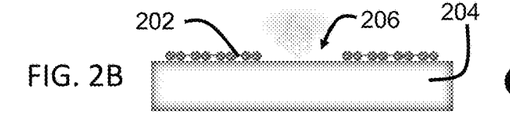
Figure 2C:
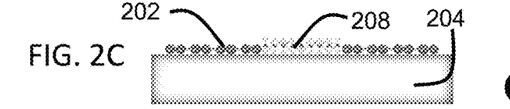
Figure 2D:
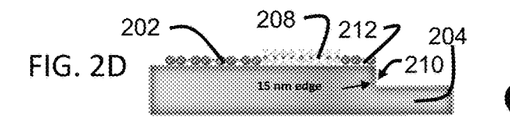
Figure 2E:
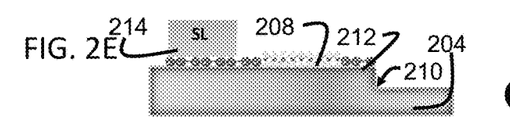
Figure 2F:
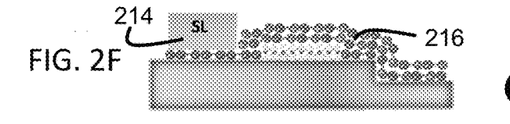
Figure 2G:
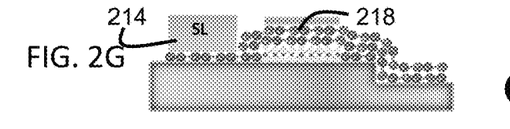
Figure 2H:
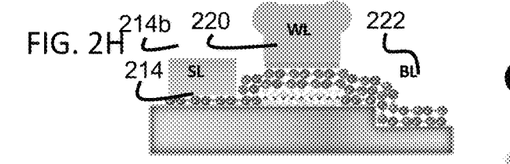
Figure 2I:
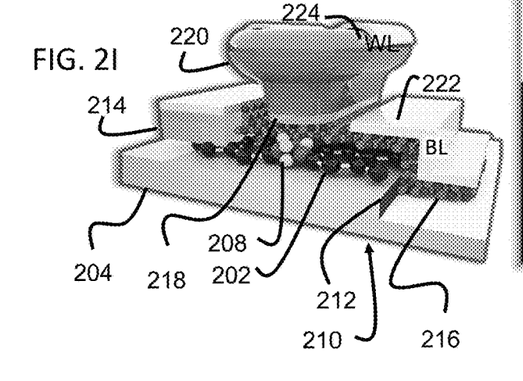
Figure 2J:
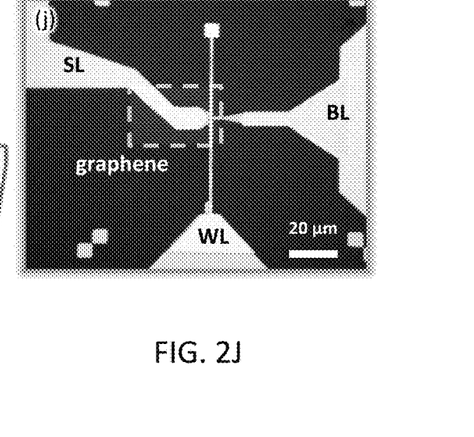
FIG. 2J illustrates an image of a prototype fabricated 0.5T0.5R memory cell resulting from the FIGS. 2A-2I method.

Fabrication and details of a preferred 0.5T0.5R memory cell 100 are shown in FIGS. 2A-2I, and an image of a prototype 0.5T0.5R memory cell in FIG. 2J. FIG. 2A shows chemical vapor deposition (CVD) grown of a monolayer 202 of conductive 2D van der Waals material, such as graphene, on an insulator substrate 204, such as a $Al_2O_3$. Other conductive 2D van der Waals materials include but are not limited to, BiTe, $CdAs_2$, $PdSe_2$, and 1T-phases of 2D-semiconducting materials like $MoTe_2$, $WTe_2$, etc. More generally, a thin conductive material can be used. By "thin", the material must be thin enough to form a conductive filament, as discussed further below. Additional examples include metals and silicides. In FIG. 2B, a gap 206 is etched in the graphene monolayer 202. Inductively coupled plasma (ICP) etching is a suitable process for forming the gap 206. FIG. 2C shows deposition of 2D semiconductor material, such as a transition-metal-dichalcogenide semiconductor 208, e.g. $WS_2$ that forms a graphene-semiconductor-graphene (GSG) heterojunction. The 2D semiconductor can be deposited by area-selective CVD or other methods to meet any thermal budget requirements. An example gate length of the GSG-heterojunction field-effect transistor (GSG-HFET) in an example prototype fabricated 0.5T0.5R is 1 μm.

In FIG. 2D, an edge step structure 210 is created, which exposes a graphene edge 212. Part of the graphene as well as the substrate underneath on one side of the $WS_2$ strip is etched down, e.g., by ~15 nm. ICP can be used to form an ultra-steep graphene/$Al_2O_3$ step 210 using $BCl_3$ as reacting gas for anisotropic etching. Subsequently, FIG. 2E shows selective deposition of electrode metal 214. For example, a bilayer of 10/50-nm Pt/Au is deposited with selective electron beam deposition (eBeamD) on the graphene 212 on an opposite other side of the 2D semiconductor 208 from the step 210 at separation from the 2D semiconductor 208. The electrode metal 214 will serves as an electrode for a transistor side of the device. In FIG. 2F, a few layers of hexagonal-boron nitride (h-BN) 216 are transferred onto the structure. The h-BN serves a dual role as a) gate dielectric for the transistor device and b) active switching layer for RRAM device components. Generally, any 2D dielectric (insulator that can store electrical energy in an electric field) can be used. Larger bandgap dielectric can help in better transistor operation while a dielectric with a lower defect formation energy would be better for low power memory operation. Prior to transfer, the h-BN film was synthesized on electro-polished Cu foil by low-pressure CVD with ammonia borane ($NH_3$—$BH_3$, Sigma-Aldrich, 97%, roughly 30 mg) as the precursor. See, D. Zhang et al., "Thickness-tunable growth of ultra-large, continuous and high-dielectric h-BN thin films," *J. Mater. Chem. C, vol.* 7, pp. 1871-1879, December 2018.

While a transfer process was used for the prototype fabrication, commercial fabrication can use one direct synthesis of the h-BN, as it can be synthesized within a required thermal budget. An example process is described for graphene to be synthesized on any dielectric substrate using pressure-assisted solid state diffusion. See, J. Jiang, J. H. Chu and K. Banerjee, "CMOS-compatible doped-multi-layer-graphene interconnects for next-generation VLSI," IEEE International Electron Devices Meeting (IEDM), 2018, pp. 34.5.1-34.5.4.

In the prototype process, before growth, the Cu foils were annealed at 1000° C. for 60 min at the pressure of 500 mTorr with the carrier gas of 30 sccm $H_2$ to create a smooth surface, then the precursor was heated up to 90° C. and kept for 20 min to deposit 5 nm thick h-BN film See, W. Liu, H. Li, C. Xu, Y. Khatami, and K. Banerjee, "Synthesis of high-quality monolayer and bilayer graphene on copper using chemical vapor deposition," Carbon, vol. 49, no. 13, pp. 4122-4130, November 2011. FIG. 2G shows deposit of additional gate dielectric 218, such as $Al_2O_3$, which serves to suppress potential gate leakage (the band gap of h-BN is not large enough, —5.5 eV). The additional $Al_2O_3$ gate dielectric layer 218 can be formed by oxidizing an Al thin film, e.g., 3-nm deposited on top of the h-BN/$WS_2$ region with a standard eBeamD and lift-off process. In FIG. 2H, using a double-layer eBeam resist liftoff process, a 3-D shape with a T-shaped cross-section Al top gate 220 is made, and serves as the mask for the self-aligned final metallization (5/15 nm Ti/Au) to form an electrode 222 at the RRAM component side and complete the source bilayer with layer 214b. The T-shape is preferred because it allows for a self-aligned process. FIG. 2I shows a perspective, partial cross-section view of a fabricated device and FIG. 2J shows a top image of an example prototype 0.5T0.5R memory cell together with three test pads for a word line (WL) 224, the bit line (BL) 222 and the source line (SL) 214. The active part of the device labelled with the rectangle is the graphene domain. The footprint of exampled fabricated 0.5T0.5R memory cells are dominated by the transistor size, which is also the case in conventional 1T1R. However, the present 0.5T0.5R exhibits: 1) enhanced electric field arising from recessed edge, which can lower switching voltage as well as switching energy; 2) confined conductive filaments at recessed edge region, resulting in lower off current; and 3) the potential for higher vertical 3D integration density.

During a field-effect transistor operation, the use of the 2D dielectric 216 acts as an insulator separating the gate electrode 220 from the channel 208, prohibiting current flow, thereby drawing opposite charges in the channel at the interface of 216 and 208 in response to an applied gate voltage. These accumulated channel charges creates a conducting channel between the source 202 and drain 212, helping with current flow and switching the transistor ON.

The basic functionality of a memory unit is to store data bits (0/1), which is manifested in the conductivity of the memory element (high/low impedance, respectively). Application of a positive voltage to the WL 220 keeping the SL 214 grounded turns the transistor ON, thereby connecting the SL with the BL 222 across the RRAM switching medium, h-BN 216. Under this condition, when a positive voltage is applied to the BL, metal ions from the BL diffuse across the h-BN insulator to reach the graphene edge 212, thereby creating a conductive filament. This created conductive filament allows current to flow from the BL to the SL, thereby presenting a low-impedance and storing digital bit 1. This is called the SET operation. The created conductive filament across the h-BN switching medium 216 of the RRAM during SET operation is a string of metal ions flowing from the BL 222 to the graphene edge 212, which is essentially the stored charge of the memory. Hence, charge is stored in the h-BN switching medium.

Application of a negative voltage to the BL, however, pulls back the metal ions from the graphene edge 212 to the BL, thereby dissolving the conductive filament, i.e. it programs the device into high impedance turning it OFF and storing digital bit 0. This is called the RESET operation. The h-BN with its large bandgap restricts normal electron flow and promotes the creation of this conductive filament under a large applied bias, thereby enabling the memory operation.

During a read operation, a positive voltage, greater than the transistor threshold voltage, is applied to the WL 220, which turns the transistor ON. The SL 214 is kept grounded, and a small voltage (much less than the memory programming voltage) is applied to the BL 222. Under such a scenario, if the memory element is programmed ON, i.e., in a low-impedance state, a current flows from the BL to the SL. This current is detected and a stored digital bit of 1 is ascertained. However, if the memory element was programmed OFF, i.e. in a high-impedance state, no current will flow from the BL to the SL, and a stored digital bit of 0 is ascertained.

The drain terminal in the transistor portion of the hybrid device cannot be accessed separately, since it is internally tied to the RRAM electrode across the RRAM switching medium. Generally, a drain electrode in a transistor refers to the electrode which collects the majority charge carriers flowing in that device (electrons for n-FET and holes for p-FET). Although this unique 0.5T0.5R device lacks an accessible drain terminal, the charges collected in this terminal flow across the conductive filament formed across the RRAM insulator, during ON programming of the RRAM (storing 1), and out through the RRAM terminal. When the RRAM is OFF (storing 0) however, these charges cannot be collected, and hence, no current flows across the transistor.

Generally, the 2D insulator region 216 supports the transmission of conductive metal ions generated from the electrodes across it at the 2D (graphene) edge, thereby leading to the creation of a conductive filament across the insulator. This created conductive filament allows current to flow thereby turning the device on. Similarly, when the power is switched off, this created conductive filament persists, thereby retaining the programming memory.

Before electrical characterization, fabricated protype devices were annealed at 200° C. for 2 hours with $H_2$ carrier gas to improve electrical contact and to remove the residue $H_2O$ molecules introduced during h-BN transfer. This thermal annealing treatment can relieve the stress introduced during fabrication and alleviate contaminants and humidity to enhance the inter-layer adhesion. In fabricated devices, the $WS_2$ channel in the GSG heterojunction was around 1 μm wide, as shown through optical imaging. Raman mapping at 353.1 cm$^{-1}$ ($E_{2g}^1$ mode of $WS_2$) showed clear feature signals for high-quality $WS_2$. As grown wafer-scale CVD h-BN film shows continuous and uniform surface on $SiO_2$/Si substrate. Raman spectrum of the h-BN film shows a characteristic peak at 1369 cm$^{-1}$ corresponding to the $E_{2g}$ vibration mode of the hexagonal B—N bonds. The thickness of h-BN films was measured to be ~5 nm by atomic-force microscope. Stronger electric-field distribution is created at the recessed edge 212, thereby alleviating the possibility of CFs being randomly generated out of the edge region, resulting in a tightly distributed SET/RESET voltage.

Figure 3A:
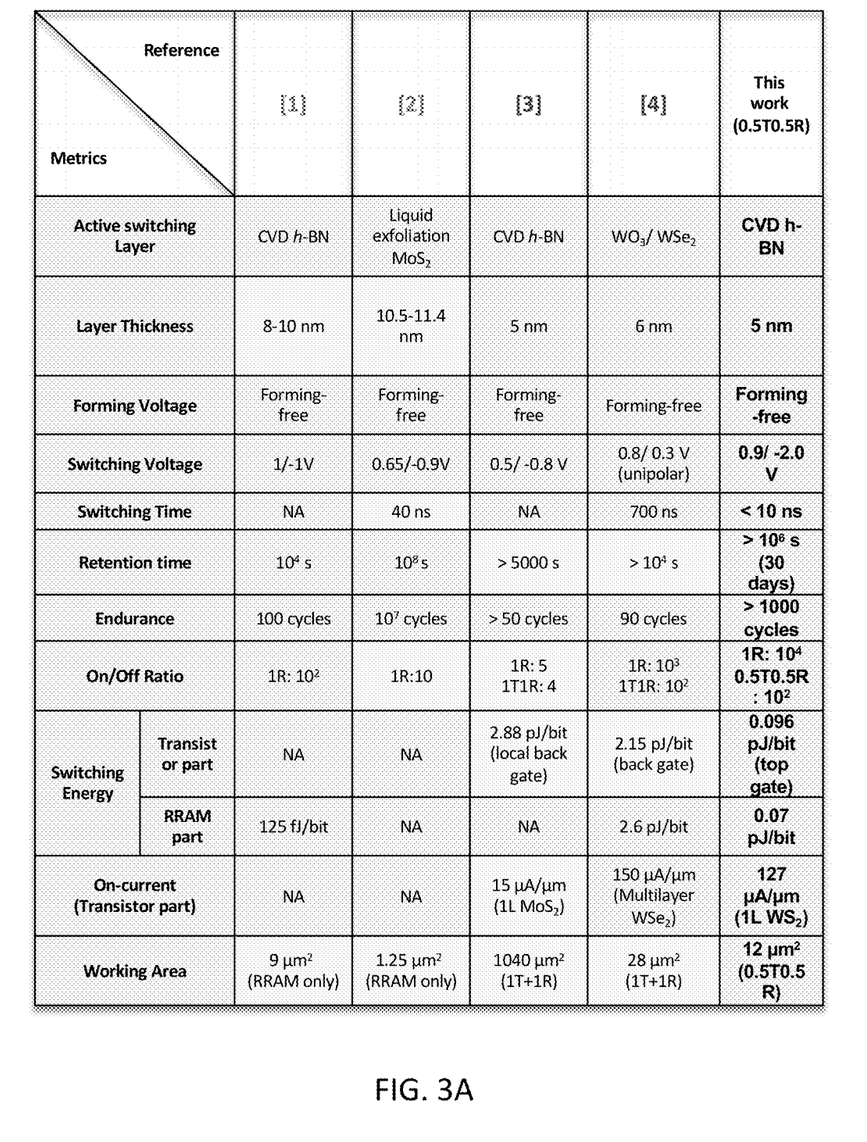
FIGS. 3A-3C compare characteristics and performance present 0.5T0.5R memory cells to the cells disclosed in the publications listed in the prior publications list above.
Figure 3B:
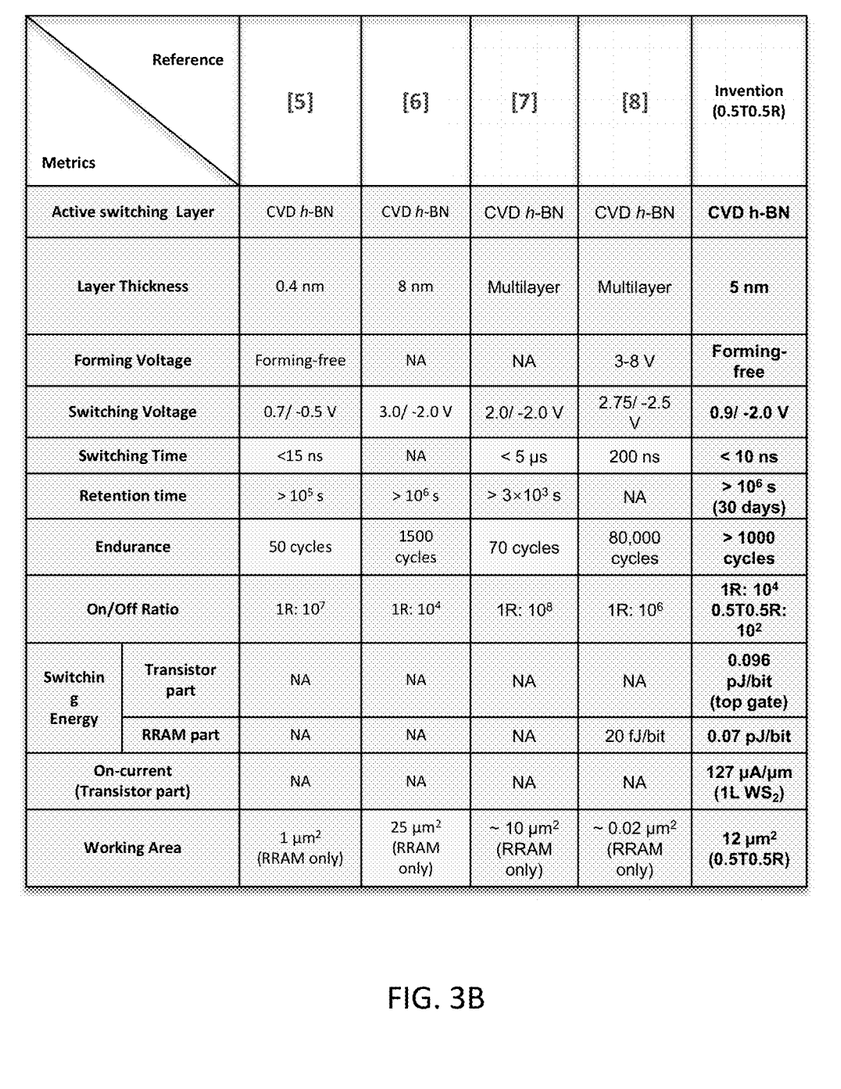
Figure 3C:
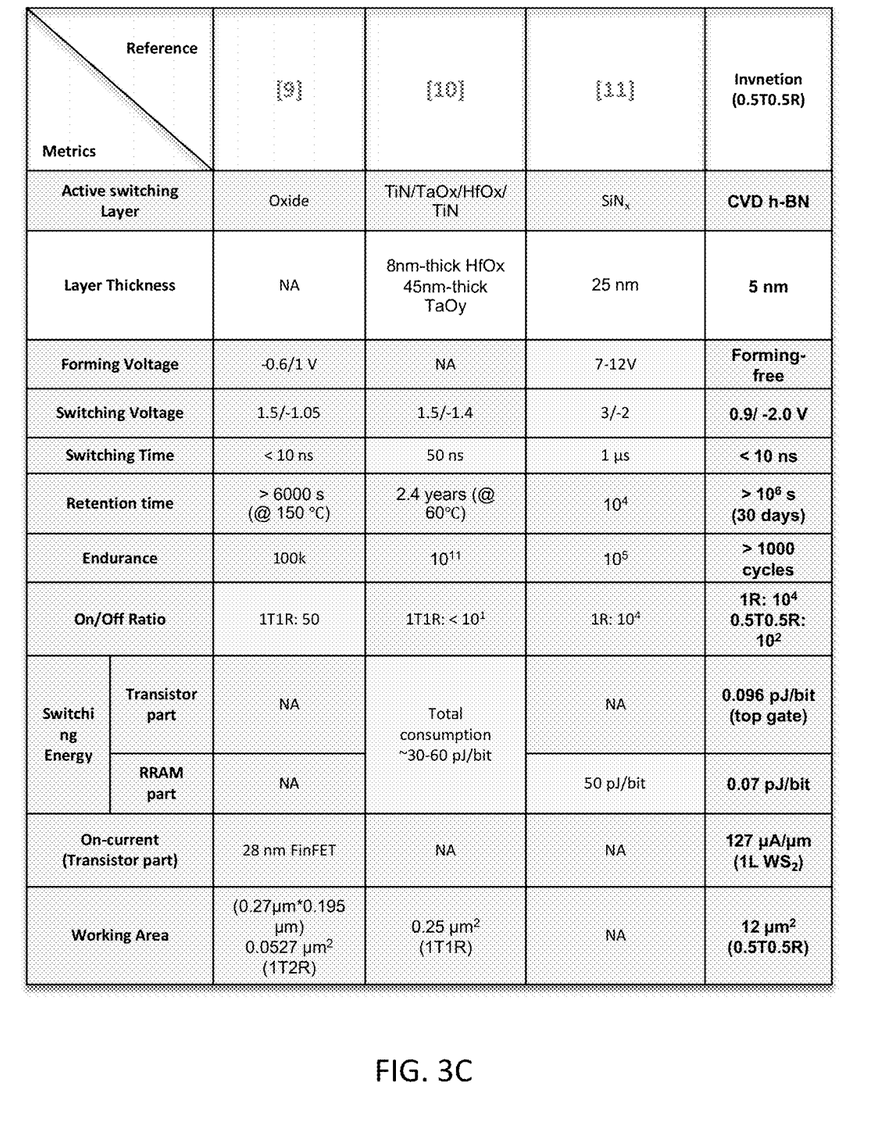

FIGS. 3A-3C compare the characteristics and performance of prototype hybrid cells of the invention to those disclosed in the in the prior publications list. The present memory cell that integrates the functionalities of both transistor and RRAM into a single "smart" device, which is uniquely enabled by vdW materials, leveraging CVD grown lateral graphene-$WS_2$-graphene heterostructure as well as vertical heterostructured h-BN/$WS_2$ and h-BN/graphene stack configurations, thereby justifying the designation of "0.5T0.5R" memory cell. This hybrid structure reduces the device count of a conventional 1T1R cell by half and is shown to exhibit extraordinary performance, energy efficiency, and compactness, as benchmarked against previous reports on vdW-material based memory cells/devices in the prior publications list above and compared in FIGS. 3A-3C. Specifically, sub-10 ns SET/RESET, 0.07 pJ/bit energy consumption, and 12 μm$^2$ cell footprint are achieved, which represents a great leap in advancing RRAM and "1T1R" memory technology. The hybrid device is very scalable and therefore can further reduce entire memory cell's lateral footprint. The 0.5T0.5R hybrid memory cell array can also be monolithically 3D-stacked to build high-density nonvolatile memory arrays and neuromorphic/in-memory computing systems, with significantly higher vertical density than the conventional 1T1R architecture (which has RRAM on top of the transistor), unprecedented performance, and energy-efficiency.

Figure 4:
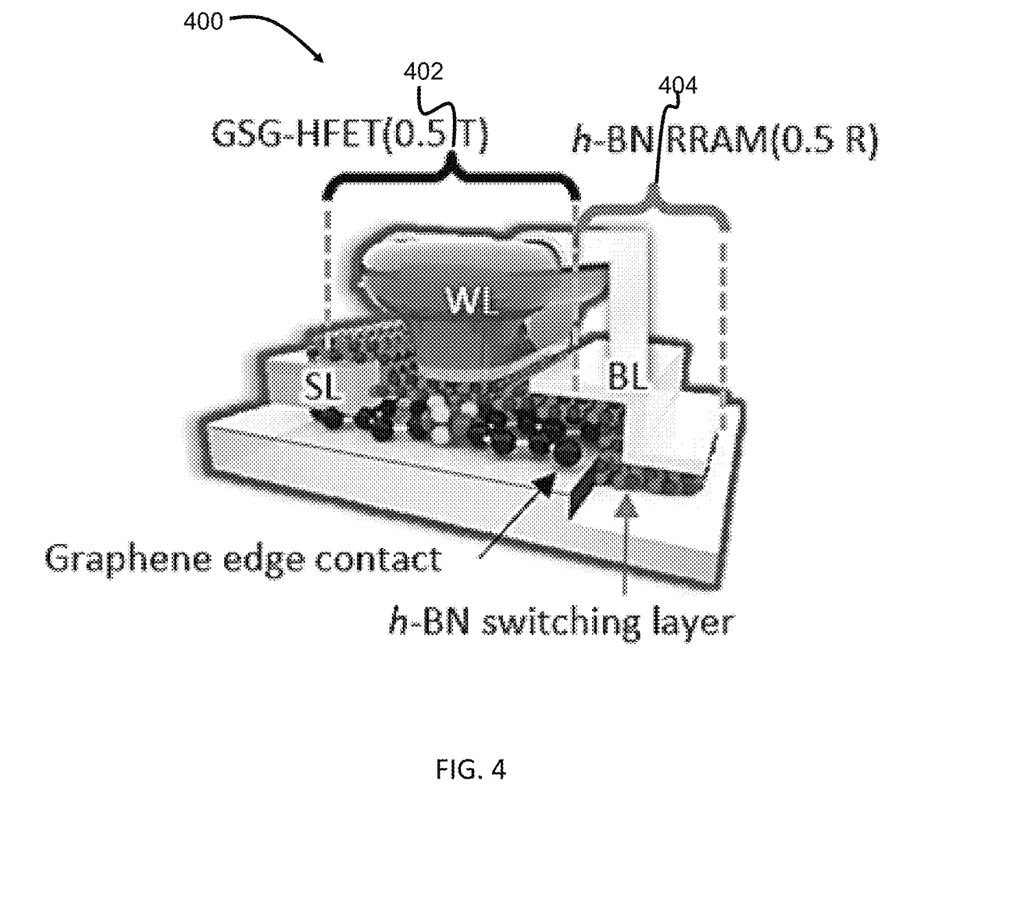
FIG. 4 illustrates another preferred 0.5T0.5R memory cell.

FIG. 4 shows another preferred embodiment hybrid cell 400. The cell 400 is a modified version of the device shown in FIG. 2I, specifically all features are the same except that the word- and the bit-lines WL 224 and BL 222 are tied together, which creates a unipolar-0.5T0.5R-RRAM cell. As with the FIG. 2I cell, there are separate transistor 402 and memory 404 portions of the hybrid device 400. The hybrid cell 400 can be driven with unidirectional current pulses, which can simplify the array design, and provide easier integration with the transistor for minimizing the static power consumption and improving the robustness of a large-scale crossbar array. The SET/RESET operation with unidirectional current pulses is achieved by creating the conducting filament employing electric-field-induced drifting for SET cycling, and dissolution of the filament employing Joule-heating for RESET cycling.

Application of an input voltage pulse that creates an electric field larger than the critical electric field, causes diffusion of the metal ions from the top electrode to the bottom electrode leading to filament formation, while the RESET cycling hinges on long-term current induced thermal energy accumulation to dissolve the conducting filament. Designing a large-scale memory array with such unipolar 0.5T0.5R-RRAMs for memory elements can therefore, cut down the number of select lines from M+2N (M and N are the number of rows and columns of the memory array, respectively) to M+N, due to the word- and bit-lines sharing a common electrode, resulting in a significant reduction in signal routing complexity and improvement in energy-efficiency, especially when array size increases.

Preferred embodiments thus demonstrate a memory cell that integrates the functionalities of both transistor and RRAM into a single "smart" device, enabled by vdW materials, and leveraging both lateral graphene-$WS_2$-graphene heterostructure and vertical heterostructured h-BN/$WS_2$ and h-BN/graphene stack configurations. The hybrid structure of FIG. 2J reduces the device count of a conventional 1T1R cell by half and is shown to exhibit extraordinary performance, energy efficiency, and compactness, as benchmarked against sharp previous reports on vdW-material based memory in FIGS. 3A-3C. Example characteristics include a sub-10 ns SET/RESET, 0.07 pJ/bit energy consumption, and 12 $\mu m^2$ cell footprint. are achieved, which represents a great leap in advancing RRAM and "1T1R" memory technology.

The ultra-scalability of any TMD (Transition Metal Dichalcogenide)—channel based FET, including the GSG-HFET, shows that the "0.5T0.5R" memory cell has great potential to further reduce entire memory cell's lateral footprint. Furthermore, the demonstrated 0.5T0.5R hybrid memory cell array can be monolithically 3D-stacked to build the ultimate high-density non-volatile memory arrays and neuromorphic/in-memory computing systems, with significantly higher vertical density than the conventional 1T1R architecture (with RRAM on top of the transistor), unprecedented performance, and energy-efficiency to emulate the workings of the human brain in the near future.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A hybrid transistor and memory cell, comprising:
a substrate with a step;
a thin conductive material on the substrate extended to an edge of the step to expose an edge of the thin conductive material;
a gap in the thin conductive material and a 2D semiconductor material formed within the gap connecting thin conductive material sections on either side of the gap;
a source electrode contacting the thin conductive material on an opposite side of the 2D semiconductor material from the edge of the thin conductive material;
a dual function gate dielectric and switching material upon the thin conductive material and the 2D semiconductor material;
a gate dielectric on the dual function dielectric in alignment with the 2D semiconductor material;
a gate electrode on the upper gate dielectric; and
a bit-line electrode on the dual function dielectric and switching material in alignment with the edge of the thin conductive material.

2. The hybrid transistor and memory cell of claim 1, wherein the thin conductive material comprises van der Waals material.

3. The hybrid transistor and memory cell of claim 2, wherein the van der Waals material comprises graphene.

4. The hybrid transistor and memory cell of claim 3, wherein the 2D semiconductor material comprises a transition-metal-dichalcogenide material.

5. The hybrid transistor and memory cell of claim 4, wherein the 2D semiconductor material comprises tungsten-disulphide ($WS_2$).

6. The hybrid transistor and memory cell of claim 4, wherein the dual function dielectric and switching material comprises hexagonal-boron nitride (h-BN).

7. A memory array with active transistor functions comprising a plurality of the hybrid transistor and memory cells of claim 1 in an array, wherein individual connections to the memory cells are via source-lines (SL) and bit-lines (BL).

8. The memory array of claim 7, wherein the SL and BL are formed of one of copper, cobalt, ruthenium, or tungsten or a bilayer thereof.

9. The memory array of claim 7, wherein the SL and BL are formed of engineered/doped multi-layer graphene interconnects.

10. The hybrid transistor and memory cell of claim 1, wherein the gate electrode and bit electrode are connected to each other to enable device switching with unidirectional current pulses, i.e., unipolar operation.

11. A hybrid transistor and memory cell, comprising:
a transistor device having a 2D semiconductor material channel;
a resistive-random-access-memory having a thin conductive material conductive edge electrode and a 2D insulator layer over the thin conductive material edge electrode, wherein the 2D insulator layer extends over the channel and serves as dielectric in the transistor device.

12. The hybrid transistor and memory cell of claim 11, wherein the thin conductive edge electrode comprises one of a van der Waals material, metal and silicide and the 2D-insulator layer comprises hexagonal boron nitride.

13. The hybrid transistor and memory cell of claim 11, wherein the thin conductive material edge is a monolayer formed over a step on an insulating substrate.

14. A hybrid transistor and memory cell, comprising:
a transistor device and a resistive resistive-random-access-memory access device that share a 2D dielectric that can store electrical energy in its electric field as a dielectric for the transistor device and as an active switching layer for the resistive resistive-random-access-memory access device;
electrodes for the transistor device and the resistive resistive-random-access-memory access device; and
thin conductive material arranged such that a confined conductive filament is created with appropriate voltage application to allow current to flow between electrodes and indicate storage of a data bit "1" and such that application of an appropriate opposite voltage removes the conductive filament to indicate storage of a data bit "0".

15. A hybrid transistor and memory cell in accordance with claim 14 in a memory array, wherein the memory array is part of a 3D integration (formed via low thermal budget transistor, memory, dielectrics and interconnect material, and their process integration schemes, and is configured as an ultra-high density (both lateral and vertical) stacked 3D integrated circuits.

* * * * *